US009245938B2

(12) United States Patent
Ohara et al.

(10) Patent No.: US 9,245,938 B2
(45) Date of Patent: Jan. 26, 2016

(54) ORGANIC EL DISPLAY DEVICE AND METHOD OF MANUFACTURING THE SAME

(71) Applicant: Japan Display Inc., Tokyo (JP)

(72) Inventors: Hiroki Ohara, Tokyo (JP); Toshihiro Sato, Tokyo (JP)

(73) Assignee: JAPAN DISPLAY INC., Tokyo (JP)

(*) Notice: Subject to any disclaimer, the term of this patent is extended or adjusted under 35 U.S.C. 154(b) by 0 days.

(21) Appl. No.: 14/548,513

(22) Filed: Nov. 20, 2014

(65) Prior Publication Data

US 2015/0144916 A1 May 28, 2015

(30) Foreign Application Priority Data

Nov. 27, 2013 (JP) ................................. 2013-244958

(51) Int. Cl.
*H01L 51/56* (2006.01)
*H01L 51/52* (2006.01)
*H01L 27/32* (2006.01)

(52) U.S. Cl.
CPC .......... *H01L 27/3276* (2013.01); *H01L 27/323* (2013.01); *H01L 27/3253* (2013.01); *H01L 51/5206* (2013.01); *H01L 51/5234* (2013.01); *H01L 51/5246* (2013.01); *H01L 51/56* (2013.01); *H01L 2227/323* (2013.01)

(58) Field of Classification Search
CPC ............ H01L 27/3276; H01L 51/5246; H01L 51/5234; H01L 51/56; H01L 27/3253; H01L 51/5206; H01L 27/323; H01L 2227/323
See application file for complete search history.

(56) References Cited

U.S. PATENT DOCUMENTS

| 6,111,357 | A  | * | 8/2000  | Fleming et al. | 313/509 |
| 6,175,186 | B1 | * | 1/2001  | Matsuura et al. | 313/483 |
| 2006/0220056 | A1 | * | 10/2006 | Lee | 257/100 |
| 2007/0018150 | A1 | * | 1/2007  | Nakajima et al. | 257/10 |
| 2007/0284998 | A1 |   | 12/2007 | Lee et al. | |
| 2010/0007268 | A1 | * | 1/2010  | Kim | 313/504 |
| 2014/0152912 | A1 | * | 6/2014  | Lee et al. | 349/12 |
| 2015/0028293 | A1 | * | 1/2015  | Jung | 257/40 |

FOREIGN PATENT DOCUMENTS

JP 2007-328339 A 12/2007

* cited by examiner

*Primary Examiner* — Donald Raleigh
(74) *Attorney, Agent, or Firm* — Lowe Hauptman & Ham, LLP

(57) ABSTRACT

The present invention is a method of manufacturing an organic EL display device including a display part arranged with a plurality of pixels including an organic EL light emitting layer, and a terminal part arranged with a plurality of terminals each connected to the organic EL light emitting layer respectively, the method comprising forming a TFT drive circuit layer controlling the organic EL light emitting layer and forming the plurality of terminals connected to the TFT drive circuit layer on a first substrate; forming the organic EL light emitting layer connected to the TFT drive circuit layer over the TFT drive circuit layer; forming a sealing film over the organic EL light emitting layer; adhering a second substrate covering the display part in a position corresponding to the first substrate; forming a touch panel sensor substrate and an electrode layer over the second substrate; and exposing the plurality of terminals by etching a part of the sealing film.

8 Claims, 10 Drawing Sheets

FIG. 7
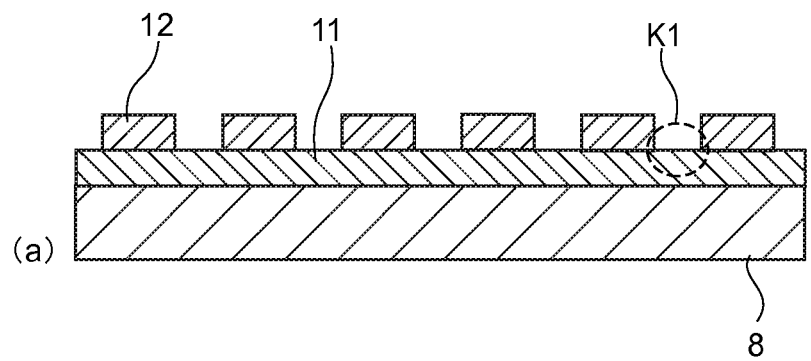
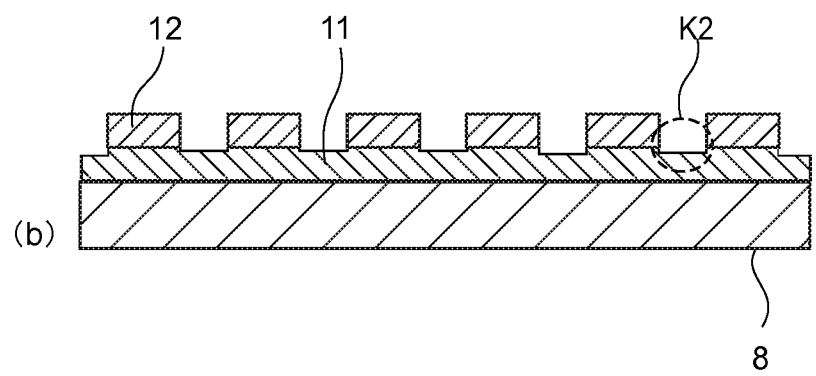

FIG. 8
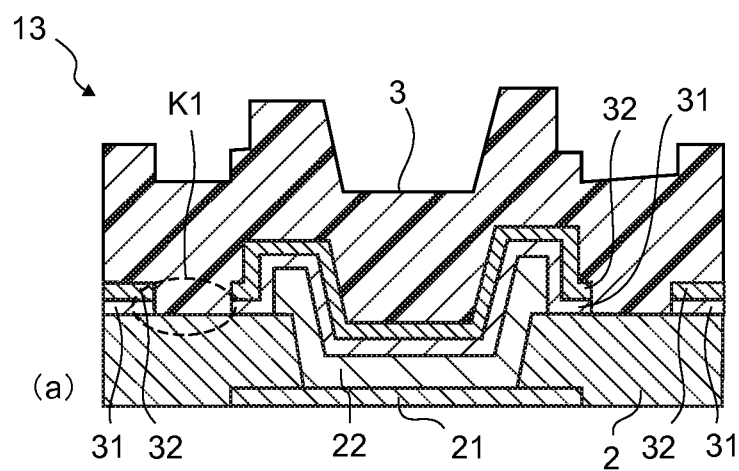
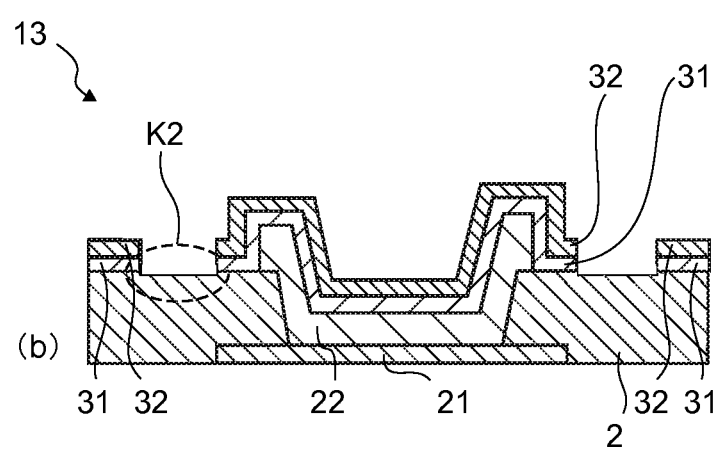

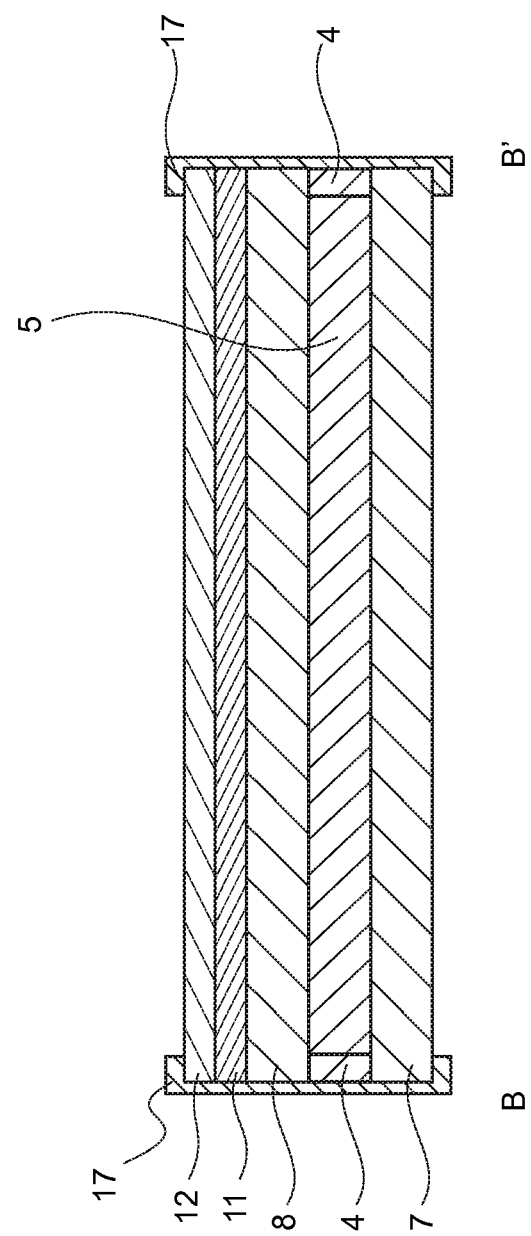

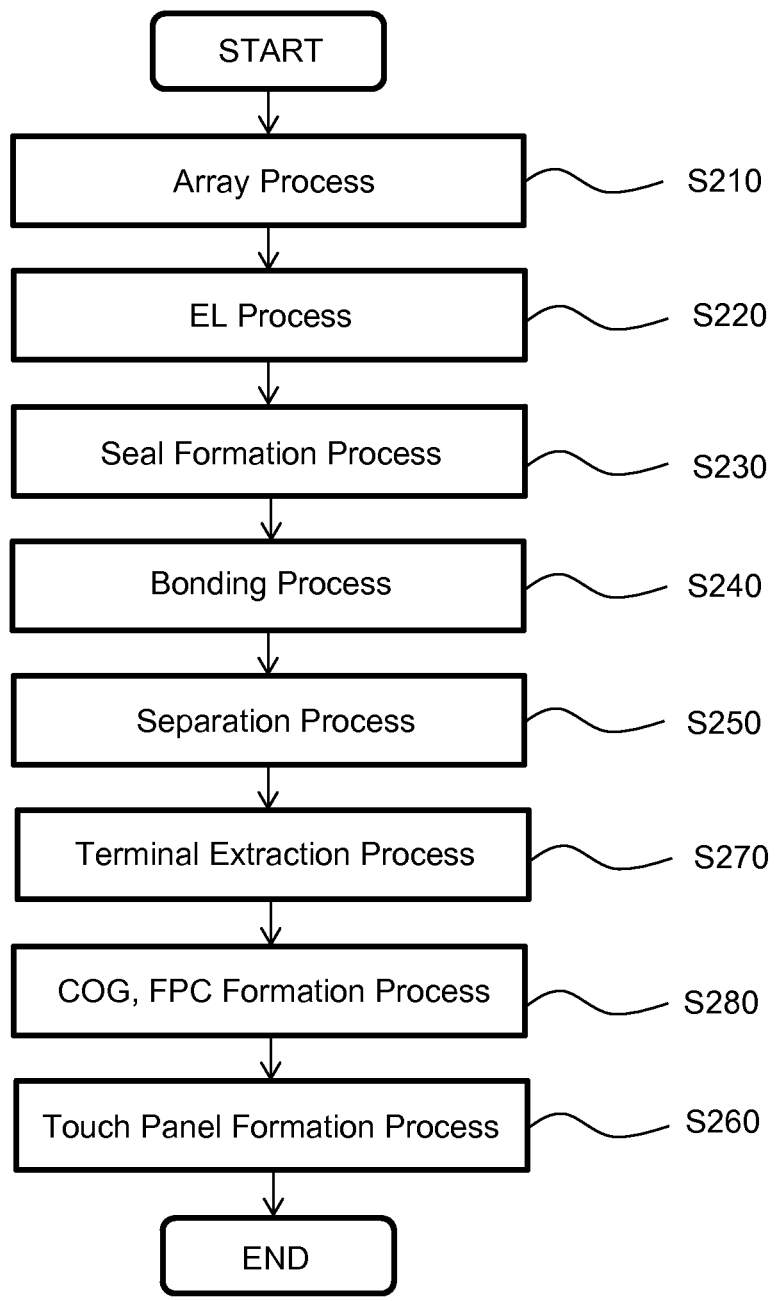

ORGANIC EL DISPLAY DEVICE AND METHOD OF MANUFACTURING THE SAME

CROSS REFERENCE TO RELATED APPLICATIONS

This application is based on and claims the benefit of priority from the prior Japanese Patent Application No. 2013-244958, filed on 27 Nov. 2013, the entire contents of which are incorporate herein by reference.

FIELD

The present invention is related to an organic EL display device arranged with a sealing means of an organic EL (electro-luminescence) light emitting layer and a method of manufacturing the same.

BACKGROUND

In recent years, the development of organic EL display devices is progressing with the goal of achieving thinner display panels, high luminosity and high speed. An organic EL display device is a display device arranged with pixels structured from organic light emitting diodes. Since the reaction speed is fast because there are no mechanical operations and each pixel itself emits light, in addition to being able to display at high luminosity, because a thin panel is possible due to the lack of a need for a backlight, the next generation of display devices are anticipated.

FIG. 1 is a vertical cross-sectional diagram showing an example of a stacked structure of an organic EL display device 10. As is shown in FIG. 1, an organic EL light emitting layer 1 is formed above a hard substrate 2 such as glass. Although a detailed depiction is omitted in FIG. 1, the organic EL light emitting layer 1 may be formed by stacking a TFT (Thin Film Transistor), a drive circuit layer, a reflection electrode, a hole injection layer, a hole transport layer, an electrode transport layer, a hole injection layer, a transparent electrode in this order from the substrate 2 side.

The organic EL light emitting layer 1 degrades rapidly when exposed to the water component within the atmosphere, it is necessary to seal the layer from outside air. Thus, as is shown in FIG. 1, the surface of the organic EL light emitting layer 1 is covered by a transparent sealing film 3 comprised from a CVD formed silicon nitride (SIN) film for example. In addition, the surface of the sealing film 3 is sometimes covered by a transparent resin 4, 5. A substrate 7 formed with the organic EL layer 1 and sealing film 3 shown in FIG. 1 is referred to as [first substrate 7] below. The organic EL display device 10 is formed by adhering an opposing substrate 6 comprising from a hard transparent component such as glass via the resin 4, 5 above the first substrate 7.

The organic EL display device 10 arranged with this type of structure is arranged with a display part 12 arranged with a plurality of pixels including the organic EL light emitting layer 1, the display part being a region for displaying an image, and a terminal part 13 which is a region arranged with a plurality of terminals 13a which carry out an electrical connection with an exterior circuit. FIG. 2 is a perspective view showing an approximate structure of the organic EL display device 10 and shows the structure of the first substrate 7 arranged with the display part 12 and terminal part 13, and the structure of a second substrate 8 and third substrate 9 arranged facing the first substrate 7. Here, the second substrate 8 and third substrate 9 shown in FIG. 2 correspond to the opposing substrate 6 shown in FIG. 1. The opposing substrate 6 is not limited to the structure shown in the diagram and may also be formed including a plurality of other substrates according to the specifications of the organic EL display device 10. The second substrate 8 may be a color filter substrate arranged with a color filter formed corresponding to each pixel. The third substrate 9 may be a touch panel arranged with a sensor device etc including a touch panel function.

As is shown in FIG. 2, in the terminal part 13, the plurality of terminals 13a are formed exposed without being covered by the opposing substrate 6 including the sealing film 3, resin 4, 5 and second substrate 8 and third substrate 9 shown in FIG. 1. The parts of the plurality of terminals 13a which are exposed are connected to an external circuit for supplying a drive signal such as a FPC (Flexible Printed Circuit) substrate. In addition, the plurality of terminals 13a is connected to the organic EL light emitting layer 1 via wiring etc formed above the substrate 2.

In this way, in the manufacturing process of the organic EL display device 10, in the case where the sealing film 3 which covers the organic EL light emitting layer 1 is formed covering the entire surface of the substrate 2, it is necessary to perform a process (also referred to below as [terminal extraction]) for exposing the plurality of terminals 13a from the sealing film 3.

A conventional method is known in which after forming the sealing film 3 above the terminal part 13, the sealing film 3 above the terminal part 3 is removed using tape peeling or etching (dry or wet) as a method for exposing the plurality of terminals 13a. In the case of removing the sealing film 3 above the terminal part 13 using etching, etching is performed after the first substrate 7 and second substrate 8 are bonded together. In this way, because the second substrate 8 itself apart from the terminal part 13 becomes a hard mask, it is possible to remove the sealing film 3 above the terminal part 13 without etching the sealing film 3 of the display part 12.

Here, for example 5 μm or less of a SiN film or 1 μm of an acryl stacked film (for example, SiN/organic resin film (acryl)/SiN, SiN/SiO (or a/Si)/organic resin film (acryl)/SiN) is sometimes used for the sealing film 3. When an etching process is performed using a plasma on the sealing film 3 comprising this type of SiN film or acryl stacked film, there is a danger that the organic EL light emitting layer 1 formed in the first substrate 7 is damaged due to heat. For example, when the temperature of the first substrate 7 rises above 100° C., degradation or crystallization occurs in the organic EL material included in the organic EL light emitting layer 1 and there was a danger that reliability of the organic EL display device 10 would be lost.

In order to reduce the effects on a display device due to this heat, a structure in which a heat sink comprised from a line shaped or mesh shaped metal material is arranged between a light emitting panel and a diffusion plate for example was used in a conventional display device (for example, refer to patent document 1 [Japanese Laid Open Patent 2007-328339]).

However, in the case of a structure in which a heat sink is arranged on the side of a light emitting panel as in the conventional display device described above, there was a danger that the effects of heat on the organic EL light emitting layer 1 due to a heat sink could not be reduced. That is, in the case of performed a terminal extraction process by removing the sealing film 3 formed in the first substrate 7 corresponding to a light emitting panel by etching, there was a danger that heat would be transmitted to the organic EL light emitting layer 1 via the second substrate 8 due to performing an etching process from the side of the adhered second substrate 8.

In addition, in the case of not using this type of etching method, for example, removing the sealing layer 3 covering the terminal part 13 by a peeling method, there was a danger that the peeling interface would not be uniform leaving peeling behind. In addition, in the case of forming the sealing film 3 which does not cover the terminal part 13 using a mask, because a separate process is necessary for cleaning the mask and a high level of accuracy is demanded for positioning, there was a danger that the manufacturing process becomes complex and yield decreases.

SUMMARY

A method of manufacturing an organic EL display device related to one embodiment of the present invention includes a display part arranged with a plurality of pixels including an organic EL light emitting layer, and terminal part arranged with a plurality of terminals each connected to the organic EL light emitting layer respectively, the method including, forming a TFT drive circuit layer controlling the organic EL light emitting layer and forming the plurality of terminals connected to the TFT drive circuit layer on a first substrate; forming the organic EL light emitting layer connected to the TFT drive circuit layer over the TFT drive circuit layer, forming a sealing film over the organic EL light emitting layer, adhering a second substrate covering the display part in a position corresponding to the first substrate, forming a touch panel sensor substrate and an electrode layer over the second substrate, and exposing the plurality of terminals by etching a part of the sealing film. The etching process may be a process which etches the sealing film using the sensor substrate or the electrode layer as a mask.

An electrode included in the electrode layer may be formed using ITO. In this case, a fluorine based gas may be used in the etching process. In addition, a silicon nitride film may be used as a sealing film.

Forming the electrode layer includes forming lead wiring connecting an electrode included in the electrode later and an external circuit, and the lead wiring may use a material with a higher conductivity than a material used for the electrode.

A film may be formed with thermal conductivity electrically connecting the lead wiring and a rear surface of the first substrate.

A plurality of concave parts may be formed by the etching process in a surface of the sensor substrate.

In addition, an organic EL display device related to one embodiment of the present invention including a display part arranged with a plurality of pixels including an organic EL light emitting layer, a first substrate arranged with a terminal part arranged with a plurality of terminals each connected to the organic EL light emitting layer respectively, a second substrate arranged in a position opposing the first substrate to cover to the display part, a touch panel including a sensor substrate and an electrode layer arranged over the second substrate, and a plurality of concave parts arranged on a surface of the sensor substrate. The plurality of concave parts may be formed according to the shape of the electrode layer. A fluorine gas may be added to the sensor substrate.

BRIEF DESCRIPTION OF DRAWINGS

FIG. 7 is a diagram for explaining the manufacturing process of an organic EL display device related to one embodiment of the present invention;

FIG. 8 is a diagram for explaining the manufacturing process of an organic EL display device related to one embodiment of the present invention;

FIG. 9 is a cross-sectional diagram showing an approximate structure of an organic EL display device related to one embodiment of the present invention; and FIG. 10 is a block diagram showing the manufacturing process of a conventional organic EL display device.

DESCRIPTION OF EMBODIMENTS

Thus, the present invention attempts to provide an organic EL display device and method of manufacturing the same which can be manufactured with improved yield by a simple manufacturing process without significantly changing a conventional manufacturing process.

The embodiments of the present invention are explained below while referring to the diagrams. Furthermore, the present invention is not limited to the embodiments herein and can be performed by various modifications without departing from the scope of the invention.

(Structure of the Organic EL Display Device 10)

Figure 1:
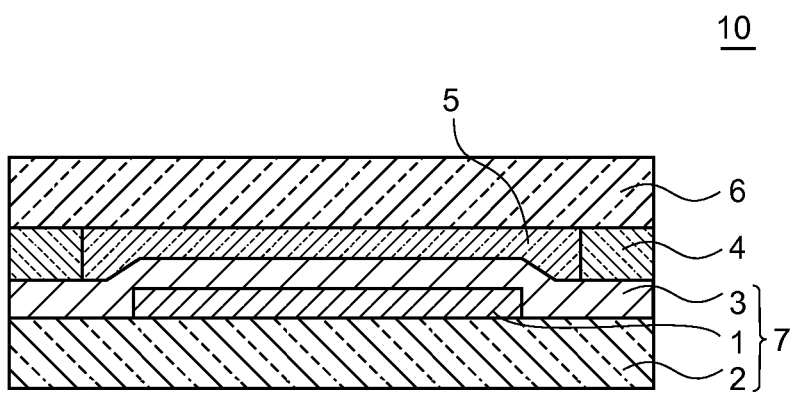
FIG. 1 is cross-sectional diagram showing an approximate structure of a stacked structure of an organic EL display device related to one embodiment of the present invention.
Figure 2:
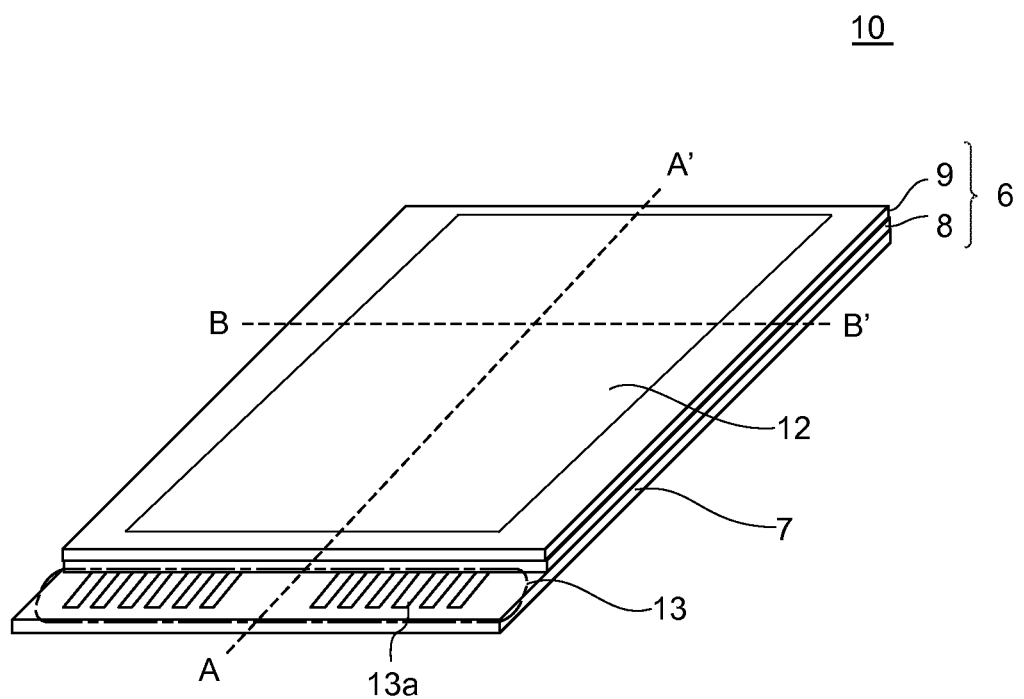
FIG. 2 is a perspective view diagram showing an approximate structure of an organic EL display device related to one embodiment of the present invention.

First, an approximate structure of the organic EL display device 10 related to one embodiment of the present invention is explained while referring to FIG. 1 and FIG. 2. FIG. 1 is a cross-sectional diagram showing an approximate structure of a stacked structure of the organic EL display device 10. FIG. 2 is a perspective view diagram showing an approximate structure of the organic EL display device 10. Furthermore, a detailed explanation of the structure described above referring to FIG. 1 and FIG. 2 is omitted below.

As is shown in FIG. 1, the organic EL display device 10 related to one embodiment of the present invention has a structure formed by bonding a first substrate 7 arranged with a plurality of pixels including an organic EL light emitting layer 1, and an opposing substrate 6 arranged facing the first substrate 7 via a dam material 4 and filler material 5. At this time, the organic EL light emitting layer 1 is formed covered by a sealing film 3.

In addition, as is shown in FIG. 2, the organic EL display device 10 includes a display part 12 arranged with a plurality of pixels including an organic EL light emitting layer 1, and a terminal part 13 which is a region in which a plurality of terminal 13a is arranged for electrically connecting with an external device. In the terminal part 13, the sealing film 3 is formed with a part removed so that the plurality of terminals 13a is exposed.

The manufacturing processes of the organic EL display device 10 related to one embodiment of the present invention arranged with this type of structure are explained below while referring to FIG. 3 to FIG. 9. In addition, the manufacturing processes of a conventional organic EL display device shown in FIG. 10 are explained for comparison with the manufacturing processes of the organic EL display device 10 related to one embodiment of the present invention.

(Manufacturing Processes of the Organic EL Display Device 10)

Figure 3:
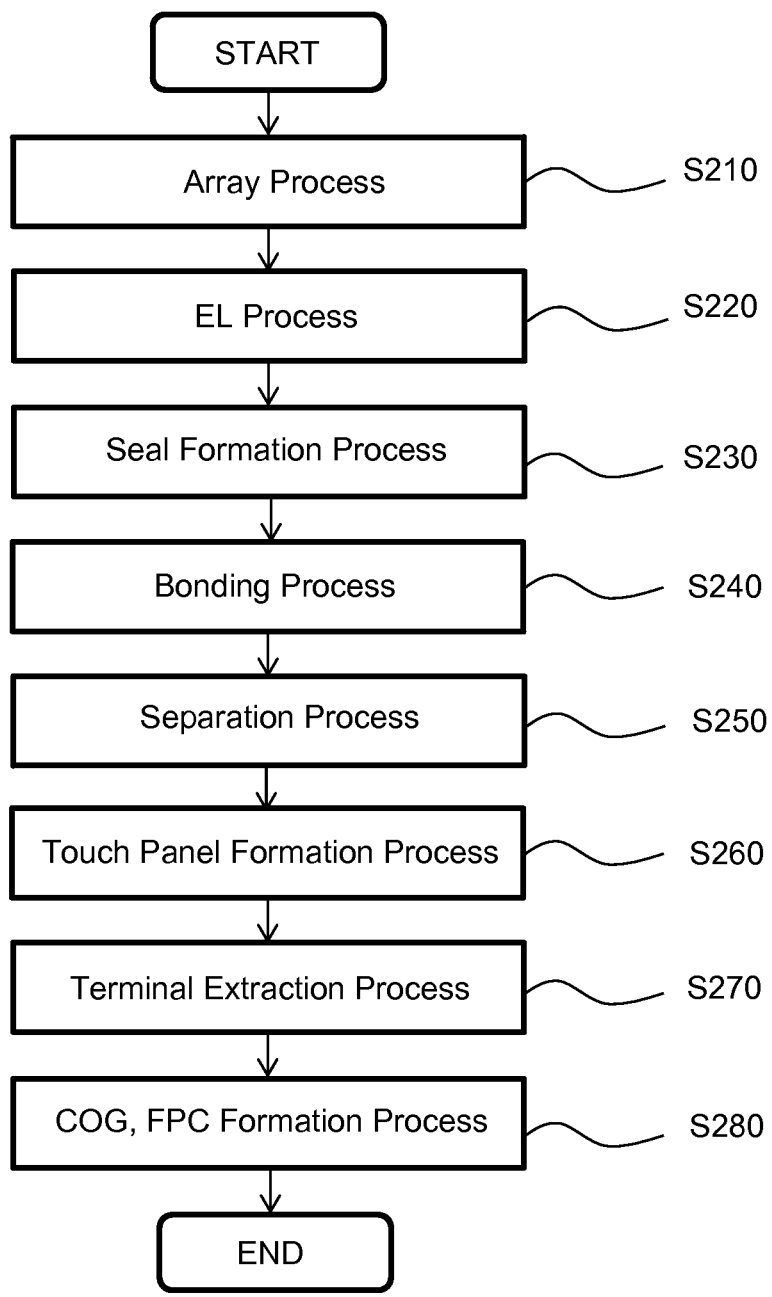
FIG. 3 is a block diagram showing a manufacturing process of an organic EL display device related to one embodiment of the present invention.
Figure 4:
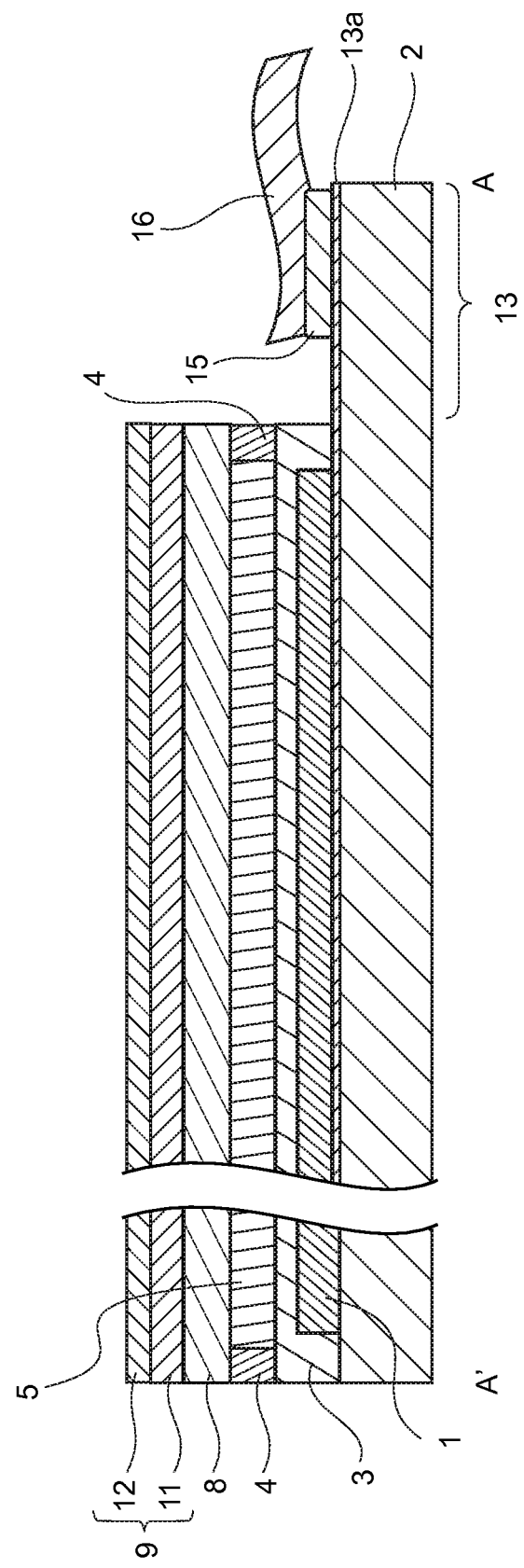
FIG. 4 is a cross-sectional diagram showing an organic EL display device related to one embodiment of the present invention.
Figure 5:
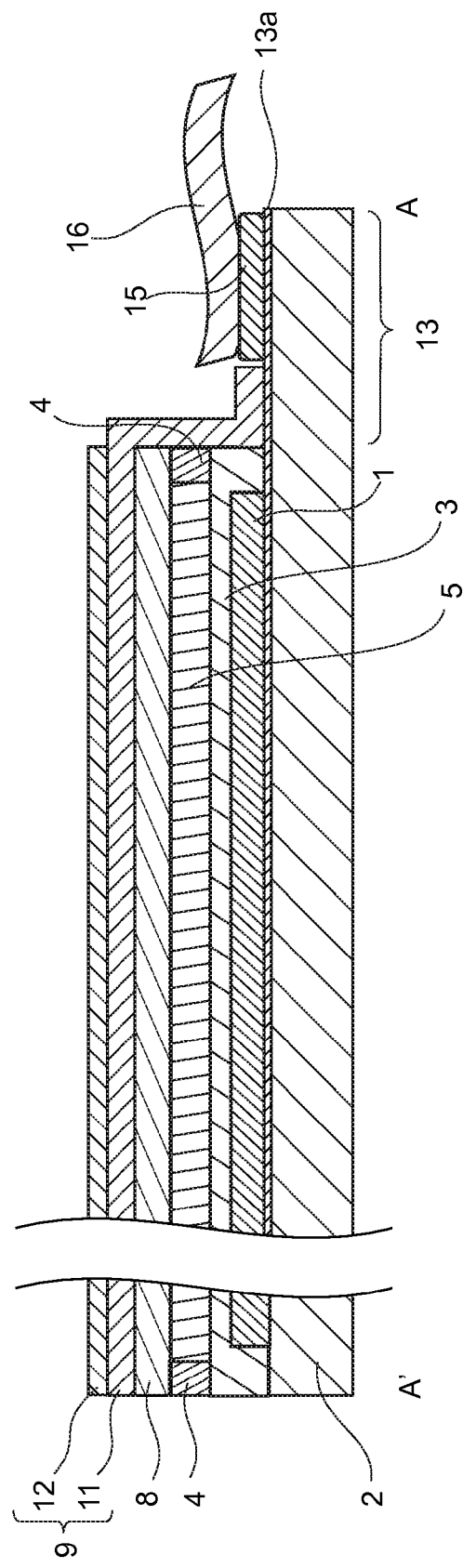
FIG. 5 is a cross-sectional diagram showing an organic EL display device related to one embodiment of the present invention.
Figure 6:
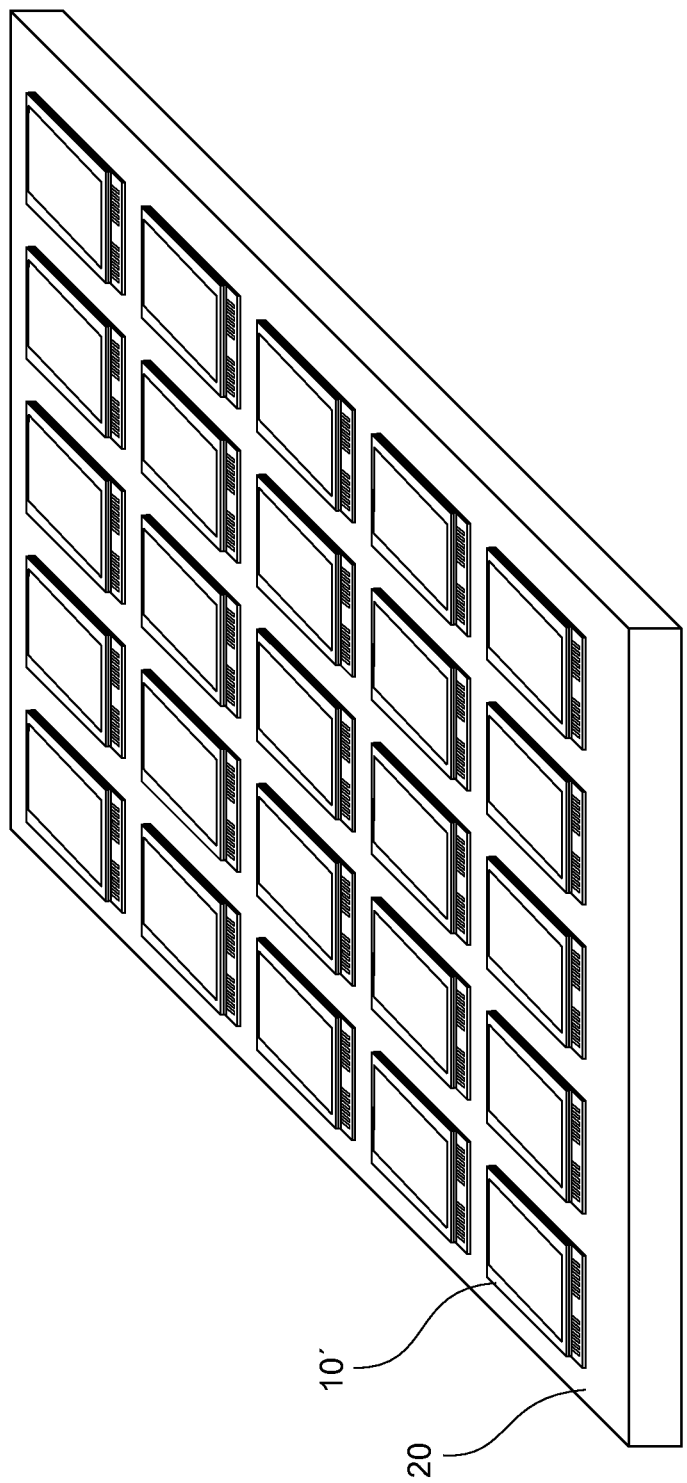
FIG. 6 is a diagram for explaining the manufacturing process of an organic EL display device related to one embodiment of the present invention.

FIG. 3 is a block diagram showing the manufacturing processes of the organic EL display device 10 related to one embodiment of the present invention. FIG. 4 and FIG. 5 are cross-sectional diagrams showing an approximate structure of the organic EL display device 10 related to one embodiment of the present invention corresponding to the cross-sectional view of the line A-A' shown in FIG. 2. FIG. 6 to FIG. 8 are diagrams for explaining the manufacturing processes of the organic EL display device 10 related to one embodiment of the present invention. FIG. 9 is a cross-sectional diagram showing the approximate structure of the organic EL display device 10 related to one embodiment of the present invention and corresponds to the cross-sectional view of the line B-B' shown in FIG. 2. FIG. 10 is a block diagram showing a manufacturing process of a conventional organic EL display device. The manufacturing processes of the organic EL display device 10 related to one embodiment of the present invention are explained in order of process based on the flow chart shown in FIG. 3.

(1) Array Process (S210)

First, in the array process S210 shown in FIG. 3, a TFT drive circuit layer is formed arranged with a plurality of wires and a light emitting control device (TFT etc) connected to each of the plurality of wires and arranged corresponding to a formation region of each organic EL display device 10 above a substrate for manufacturing (not shown in the diagram). Here, the substrate for manufacturing is a substrate in which a plurality of organic EL display devices 10 are separated and extracted in a process described herein and corresponds to the substrate 2 shown in FIG. 1 in each organic EL display device 10.

The TFT drive circuit layer includes a light emitting control device for controlling light emitted from the organic EL light emitting layer 1 included in each pixel. The light emitting control device is connected to a drive circuit (X driver, Y driver, shift register etc) for adjusting the selection and amount of light emitted by each pixel, and multiple wires which are connected to ground as well as supply a power voltage and drive signal to each drive circuit.

An insulation layer (not shown in the diagram) comprised from silicon oxide or silicon nitride etc is formed by a CVD method as a planarized film above the TFT drive circuit layer. The plurality of terminals 13a is formed in a region corresponding to the terminal part 13 shown in FIG. 2 above the insulation layer. The plurality of terminals 13a are each connected to the end part of a wiring pattern respectively connected to each light emitting control device via a contact hole formed with the insulation layer and wiring etc formed within the contact hole.

(2) EL Process (S220)

Next, in an EL process S220, among the organic EL light emitting layers 10 described above, except for the TFT drive circuit layer, for example, a stacked structure is formed of a reflecting electrode, a hole injection layer, a hole transport layer, a light emitting layer, an electron transport layer, an electron injection layer and a transparent electrode. The organic EL light emitting layer 1 is formed using a known method corresponding to each pixel in a region corresponding to the display part 12 shown in FIG. 2.

(3) Seal Formation (S230)

Next, in the seal formation process S230, a sealing film 3 is formed to cover the organic EL light emitting layer 1 and plurality of terminal 13a. A 5 μm or less of silicon nitride (SiN) film or 1 μm of an acryl stacked film (SiN/organic resin film (acryl)/SiN, SiN/SiO (or a/Si)/organic resin film (acryl)/Sin) is formed for the sealing film 3. The sealing film 3 is formed to cover the entire surface of the substrate for manufacturing used a known method such as a CVD method. Furthermore, the structure described hereto corresponds to the structure of the first substrate 7 shown in FIG. 1.

The sealing film 3 which protects the organic EL light emitting layer 1 from oxygen or water is applied with a single layer structure or stacked structure. In a single layer structure, silicon nitride (SiN) with a film thickness of 5 μm or less is used. However, in a stacked structure, a repeating structure of a 2 layer stacked structure and 3 layer stacked structure is used. As an example, in a 3 layer stacked structure, a first inorganic film/resin/second inorganic film is used, and a thin inorganic film may be further arranged between the first inorganic film and an organic resin film. A Si contained inorganic film may be applied to the first inorganic film and second inorganic film, specifically, SiN. SiON (SiOxNy), and $SiO_2$ (SiOx). In addition, the resin used may be on organic resin such as acryl resin, polyimide resin, epoxy resin, or an inorganic resin such as a silicon resin such as siloxane. For example, a film thickness of 200-600 nm of an Si contained inorganic film and 200-800 nm of an organic resin are suitable.

Next, a dam material 4 is formed above the substrate for manufacturing formed with the sealing film 3 by coating a resin with a comparatively high viscosity before curing using a dispenser. The dam material 4, for example, may be formed using a UV curing type or thermosetting type transparent resin such as epoxy resin or acryl resin. The dam material 4 is a bank layer which functions as a sectioning component between the display part 12 and terminal part 13 and a sectioning component between the plurality of adjacent organic EL display devices 10. As a result, the shape of the dam material may be a frame shape enclosing the display part 12. By forming the dam material 4 between the display part 12 and the terminal part 13, it is possible to configure the device so that the filler material filled on the inner side of the dam material 4 in the manufacturing process described below is not exposed in the terminal part 13. In this way, because the dam material 4 defines the region of the filler material 5, the resin used for the dam material 4 has a higher viscosity before curing than the resin used for the filler material 5.

A resin with a comparatively low viscosity before curing is dripped at a certain pitch as the filler material 5 above the display part 12 on the inner side of each of the plurality of dam material 4 formed in this way. For example, a UV cured type or thermosetting type transparent resin such as epoxy resin or acryl resin can be used as the filler material 5.

(4) Bonding of the First Substrate 7 and Second Substrate 8 (S240)

Next, in the bonding process S240, a substrate for manufacturing corresponding to the second substrate 8 is bonded above the substrate for manufacturing corresponding to the first substrate 7 inside a chamber with a reduced pressure, the filler material 5 is spread throughout an entire space enclosed by both substrates and the dam material 4, and the dam material 4 and filler material 5 are cured and adhered under an atmosphere. Here, the substrate for manufacturing corresponding to the second substrate 8 is formed with a color filter corresponding with each pixel of the organic EL display device 10. The color filter is formed on a surface of the second substrate 8 facing the first substrate 7. The first substrate 7 and second substrate 8 are bonded together while positioning each color filter formed on the second substrate 8 to correspond with each pixel region above the first substrate 7.

Furthermore, although not shown in the diagram, the substrate for manufacturing corresponding to the second substrate 8 may be arranged with a size which covers the display part 12 of each organic EL display device 10 and the end of the second substrate 8 on the side of the terminal part 13 may be formed including a shape which does not cover the upper part of the terminal part 13. For example, the substrate for manufacturing corresponding to the second substrate 8 may be formed so that the end part on the side of the terminal part 13 does not jut out above the terminal part 13 as in the second substrate 8 shown in FIG. 4, and the end of the second substrate 8 on the side of the terminal part 13 and the end of the sensor substrate 11 on the side of the terminal part 13 may be formed to have an aligned shape above roughly the same surface. In addition, in the bonding process S240, after bonding the substrate for manufacturing corresponding to the second substrate 8 to cover the entire surface of the substrate for manufacturing corresponding to the first substrate, each may be cut into a shape so that the upper part of the terminal part 13 is not covered for each of the organic EL display devices 10 in the separating process S250 described below. In this way, the second substrate 8 is formed into a shape which does not cover the plurality of terminals 13a exposed from the sealing film 3 above the terminal part 13.

After the substrate for manufacturing corresponding to the first substrate 7 and the substrate for manufacturing corresponding to the second substrate 8 are aligned and bonded together, the substrate for manufacturing corresponding to the first substrate 7 and the substrate for manufacturing corresponding to the second substrate 8 are mutually adhered by curing the dam material 4 and the filler material 5. For example, in the case where a UV cured type resin is used for the dam material 4 and a thermosetting type resin is used for the filler material 5, the filler material 5 may undergo a thermosetting process within a heating furnace after the dam irradiating UV rays on the dam material 4 through the second substrate 8. By adopting this type of bonding process S240, it is possible to obtain a structure body wherein the substrate for manufacturing corresponding to the first substrate 7 and the substrate for manufacturing corresponding to the second substrate 8 are adhered together.

(5) Separation (S250)

Next, in the separation process S250, the structured body wherein the substrate for manufacturing corresponding to the first substrate 7 and the substrate for manufacturing corresponding to the second substrate 8 are adhered together is separated for each region corresponding to each organic EL display device 10 using a known method such as scribe break. Furthermore, after the separation step S250, although not shown in the flow chart in FIG. 3, a polarizing plate may be formed above the second substrate 8 according to the specifications of the organic EL display device 10.

(6) Touch Panel Formation (TP) (S260)

After the separation process S250, among the structure of each touch panel 9 above the second substrate 8, a sensor substrate 11 and ITO layer 12 are formed (S260). The touch panel 9 used in one embodiment of the present invention is, for example, a resistive membrane type or capacitance type touch panel. The touch panel 9 includes the sensor substrate 11 and the ITO layer 12 formed above the sensor substrate 11 as shown in FIG. 4.

The touch panel 9 is generally formed with a hard coat substrate (not shown in the diagram) above the sensor substrate 11 arranged with the ITO layer 12, and is completed by further forming with a casing (not shown in the diagram).

However, in this process S260, among the structure of the touch panel 9, a structure is formed up to forming the ITO layer 12 above the sensor substrate 11. Therefore, in the terminal extraction process S270 described below, an etching process of the sealing film 3 is performed while the ITO layer 2 is on the uppermost layer.

A transparent electrode comprised from ITO is formed with a certain pattern in the ITO layer 12. For example, the transparent electrode includes in the ITO layer 12 is formed in a lattice shape and controlled by an external IC etc. Furthermore, while the transparent electrode used in the touch panel 9 is formed from ITO, although a structure arranged with the ITO layer 12 is described below, a material such as IZO (Indium Zinc Oxide), Ag wire, Ag nanoparticle, Graphene, or CNT (Carbon Nanotube) may be used for example as an electrode formed above the sensor substrate 11 in addition to ITO.

The sensor substrate 11 and ITO layer 12 have a shape which does not jut out from an end of the second substrate 8 on the terminal part 13 side, that is, a shape which does not cover up to the exposed part of the plurality of terminals 13a. In this way, by providing the sensor substrate 11 and ITO layer 12 with a shape which does not cover a terminal 13a of the terminal part 13, it is possible to provide a shape which does not physically obstruct removal of the sealing film 3 above the terminal part 13 in the terminal extraction process S270 described below.

For example, the sensor substrate 11 and ITO layer 12 may be formed with a shape wherein the end of the second substrate 8 on the terminal part 13 side and the end of the sensor substrate 11 on the terminal part 13 side are aligned roughly above the same surface. In addition, it is not necessary to remove the sealing film 3 with regards to a region of the terminal part 13 part from a region where the plurality of terminals 13a and an exterior circuit (FPC: flexible print substrate) 16 are connected as is shown in FIG. 4. As a result, as is shown in FIG. 5, a structure may be adopted whereby an upper part of a region which is not directly connected to the exterior circuit 16 is covered by the sensor substrate 11. At this time, although not shown in FIG. 5, the ITO layer 12 above the sensor substrate 11 may also be formed in a shape extending from an end of the second substrate 8 to match the shape of the sensor substrate 11.

(7) Terminal Extraction Process (S270)

Next, the sealing film 3 which covers the plurality of terminals 13a in the terminal part 13 is removed and a terminal extraction process is performed for exposing each of the plurality of terminals 13a (S270). As is shown in FIG. 6, the terminal extraction process is a batch process involving mounting a separated structure (called a [cell] below) on a tray 20 and performing a dry etching process. FIG. 6 shows a structure in which a plurality of separated cells 10' is arranged above the tray 20. Furthermore, FIG. 6 shows a structure in which the sealing film 3 is already removed from above the terminal part 13.

The material of the tray 20 uses an aluminum alloy (A5052 etc) with high thermal conductivity and is further coated in an alumite treatment. In addition, the tray 20 is cooled to about 20° C. by a chiller (not shown in the diagram) arranged in a general etching apparatus. By heat transferring the panel temperature to the tray 20, it is possible to dissipate heat generated in the etching process in a short period of time. By performing an etching process while cooling the tray 20 using this type of apparatus, it is possible to prevent degradation caused by heat with respect to an organic material which forms the organic EL light emitting layer 1, and ensure that reliability of the organic EL light emitting layer 1 is not lost.

Here, the flow chart of a conventional manufacturing process shown in FIG. 10 is referred to. A conventional terminal extraction process S270 is performed after bonding the first substrate 7 and second substrate 8 and separating and before the formation process S260 of the touch panel 9. Therefore, according to a conventional terminal extraction process S270, it is the second substrate 8 formed with a color filter etc on a glass substrate with insulation properties which directly receives the effects of heat due to an etching process. In this way, when etching is performed when the second substrate 8 is on the uppermost layer, because the glass substrate with insulation properties directly receives plasma heat due to the etching process, there is a danger of the panel temperature increasing without being conducted. In addition, according to a the conventional terminal extraction process S270, because the distance from the second substrate 8 to the first substrate 7 arranged with the organic EL light emitting layer 1 is close, there is a danger of heat from the plasma process directly affecting the organic EL light emitting layer 1.

However, in the manufacturing process of the organic EL display device 10 related to one embodiment of the present invention, the terminal extraction process S270 is performed in the post process of the formation process S260 of the touch panel 9. That is, among the structure of the touch panel 9, because the terminal extraction process S270 is performed after the formation process of the ITO layer 12, it is the ITO layer 12 arranged on an uppermost layer which directly receives plasma heat due to the etching process. At this time, because a transparent electrode comprised from a lattice structure is formed in the ITO layer 12 it is easy for heat to be conducted. Therefore, the plasma heat caused by the etching process can be dissipated via a lattice shaped electrode of the ITO layer 12 arranged on the uppermost layer.

In addition, according to the manufacturing process related to one embodiment of the present invention, because the terminal extraction process S270 is performed after the sensor substrate 11 and ITO layer 12, it is also possible to provide some distance between the uppermost layer part which can easily directly receive heat due to an etching process. In addition, because the second substrate 8 and resin 4 comprised from a glass substrate (silicon oxide) with a low heat conductivity is arranged below the sensor substrate 11 which directly receives heat caused by the etching process, it is difficult for heat to be transferred to the organic EL light emitting layer 1. Therefore, according to the manufacturing process of the organic EL display device 10 related to one embodiment of the present invention, it is possible to reduce damage caused by heat received by the organic EL light emitting layer 1 and remove the sealing film 3 compared to the conventional terminal extraction process S270.

The etching gas used in this terminal extraction process is a single gas such as a fluorine based gas (for example, $SF_6$, $CF_4$, $NF_6$ etc), and oxygen ($O_2$) or a mixed gas. Furthermore, argon (Ar) or nitrogen ($N_2$) is sometimes added. By using this type of etching process, in the case where a silicon nitride (SiN) film is used for the sealing film 3, it is possible to increase the selection ratio of SiN with respect to ITO. As a result, it is possible to reduce the damage caused by etching to the ITO layer 12.

Here, although the ITO layer 12 is etched using a chlorine based etching gas, the ITO layer is almost not etched at all by a fluorine based gas. Therefore, in the present invention, a fluorine based gas is used without using the chlorine based etching gas. For example, although the ITO layer 12 is almost not etched at all in the case where a mixed gas of $SF_6/O_2$ is used as an etching gas, because etching of the sensor substrate 11 progresses, slight film loss occurs in the sensor substrate 11. At this time, in the structure before the etching process shown in FIG. 7 (a), film loss occurs according to the shape of the ITO layer 12 arranged in a lattice shape in a vertical direction or horizontal direction as is shown in FIG. 7 (b) in the surface K1 of the sensor substrate 11 which was flat, and a plurality of concave parts K2 are formed. Furthermore, even if the main component of the sensor substrate 11 is a silicon oxide (SiO) glass, even in the case of a flexible substrate such as a polyimide resin (PI), slight film loss similarly occurs in a position except where the ITO layer 12 is arranged.

In addition, in the terminal part 13 before the etching process, a structure in which two ITO films 31, 32 are formed above the terminal electrode 22 and the sealing film 3 is formed above the ITO film 32 as exemplified in FIG. 8 (a) as an example. Here, a terminal electrode 22 connected to wiring 21 may be formed at the same time as forming a source/drain electrode of a light emitting control device (TFT). The ITO films 31, 32 above the terminal electrode 22 may be formed at the same time as forming a transparent electrode of the organic EL light emitting layer 1. By removing the sealing film 3 by etching, concave parts K2 are sometimes formed on the surface of the substrate 2 even in the terminal part 13 due to film loss as is shown in FIG. 8 (b).

Furthermore, doping sometimes occurs in the sensor substrate 11 etc due to the etching gas by etching the sealing film 3. For example, there is a possibility that S (sulfur) or F (fluorine) is doped in the case where $SF_6$ is used as the etching gas. However, doping fluorine in the ITO layer 12 is suitable for achieving low resistance because fluorine becomes a donor.

In this way, according to the manufacturing process related to one embodiment of the present invention, the concentration of fluorine increases in the sensor substrate 11 due to fluorine doping for example compared to a sensor substrate which has not undergone an etching process. In addition, the surface of the ITO layer 12 above the sensor substrate 11 sometimes crystalizes caused by a rise in temperature due to plasma heat. Furthermore, in the case where a metal is used as lead wiring of the ITO layer 12, an oxide film is sometimes formed on the surface of the wire by using oxygen in the etching gas. Therefore, in the case where this characteristic is seen above the sensor substrate 11 and ITO layer 12, it can be understood that the sealing film 3 has been removed after forming the sensor substrate 11 and ITO layer 12 as in the present invention. In addition, in the case where concave parts K2 shown in FIG. 7 (b) and FIG. 8 (b) are seen above the sensor substrate 11, it can be understood that the sealing film 3 has been removed after the sensor substrate 11 and ITO layer 12 have been formed. Furthermore, the same characteristic can also be confirmed when not only $SF_6/O_2$ is used as the process gas but also $CF_4$ or $NF_3$ etc.

A material with a higher conductivity than a transparent electrode comprised form ITO is used in the lead wiring connecting the electrode of the ITO layer 12 and external IC. In this way, it is possible for heat received by the display part 12 to escape via the lead wiring which links the display part 12 to an external IC. For example, although the thermal conductivity of ITO is about 8 W/mK, because aluminum is about 200 W/mK, it is possible to use aluminum for the lead wiring. In this way, by forming a transparent electrode in the display part 12 using ITO etch and forming the lead wiring which links to the exterior using a metal with a high conductivity and high thermal conductivity, heat transfers easily to the periphery from above the display part 12. Furthermore, because the lead wiring is formed below a frame shape black matrix, it does not have to be transparent.

Furthermore, a part or all of the lead wiring of the sensor substrate 11 may be formed by connecting to the tray 20 made from metal (aluminum, magnesium etc) or a component within an etching chamber. By adopting this type of structure, it is possible to reduce the panel temperature during the etching process. Furthermore, it is more effective when cooled to about 20° C. using a chiller when connecting to the tray 20.

In addition, by electrically connecting the transparent electrode of the ITO layer 12 and the surface of the first substrate 7, dissipation effects of heat caused by an etching process may be obtained. As is shown in FIG. 9, a film 17 with a high thermal conductivity may be arranged to cover an end of a substrate stacked structure and the lead wiring of the ITO layer 12 and rear surface of the first substrate 7 connected. At this time, the lead wiring of the ITO layer 12 is formed to connect to the film 17 with high thermal conductivity and the transparent electrode of the ITO layer 12 of the sensor substrate 11 is connected to the rear surface of the first substrate 7. By adopting this structure, even if the panel temperature rises during the etching process, because the rear surface of the first substrate 7 is in contact with a cooled tray 20, further heat dissipation effects can be expected by using the film 17 with a high thermal conductivity arranged on an end part as a heat dissipation path. A film having adhesiveness may also be used as the film 17 with high thermal conductivity. An adhesive may also be used in the case where the film does not include adhesiveness.

Furthermore, although a structure arranged with an ITO layer 12 wherein an electrode used in the touch panel 9 is ITO was described above, materials such as IZO, Ag wire, Ag nanoparticle, grapheme and CNT etc in addition to ITO may be used for the electrode formed above the sensor substrate 11. It is also possible to obtain the effect of reducing a panel temperature the same as the ITO layer 12 described above in the case where an electrode is formed above the sensor substrate 11 using these materials. In addition, it is possible to obtain the same heat dissipation effects as the ITO layer 12 described above by determining the etching gas used in the etching process and material used for the lead wiring according to the material of each electrode.

A hardcoat substrate (not shown in the diagram) is formed above the sensor substrate 11 and ITO layer 12 of the touch panel after the terminal extraction process S270, and a casing (not shown in the diagram) is further formed. As described above, because a concave K2 is formed by film loss in the surface of the sensor substrate 11 in the terminal extraction process S270, it is possible to increase adhesion of a hardcoat substrate with respect to the sensor substrate 11.

(8) COG, FPC Formation Process (S280)

A part of the sealing film 3 above the terminal part 13 is removed by the terminal extraction process S270 described above and the plurality of terminals 13a is exposed. The exposed plurality of terminals 13a connect a FPC 16 via an anisotropic conductive film 15 using a COG mounting method as shown in FIG. 4 and FIG. 5. In addition, although not shown in the diagram, a connection with an external IC is also formed in the touch panel 9. By adopting this process, the organic EL display device 10 related to one embodiment of the present invention is formed.

As described above, according to the manufacturing method of the organic EL display device 10 related to one embodiment of the present invention, by performing an etching process to remove the sealing film 3 which covers a terminal part 13 after forming the sensor substrate 11 and ITO layer 12 of the touch panel 9, it is possible to dissipate heat generated in the etching process via the ITO layer 12 without significantly changing a conventional manufacturing process. Therefore, it is possible to reduce damage received by the organic EL light emitting layer 1 due to a rise in panel temperature. According to the manufacturing method of the organic EL display device 10 related to one embodiment of the present invention, because it is possible to improve the reliability of the organic EL light emitting layer 1, it is possible to provide the organic EL display device 10 with improved image quality.

Therefore, according to the manufacturing method of the organic EL display device 10 related to one embodiment of the present invention, it is possible to reduce manufacturing costs using a simple manufacturing process, improve yield, and provide the organic EL display device 10 with improved image quality.

What is claimed is:

1. A method of manufacturing an organic EL display device including a display part arranged with a plurality of pixels including an organic EL light emitting layer, and a terminal part arranged with a plurality of terminals each connected to the organic EL light emitting layer respectively, the method comprising:
    forming a TFT drive circuit layer controlling the organic EL light emitting layer and forming the plurality of terminals connected to the TFT drive circuit layer on a first substrate; forming the organic EL light emitting layer connected to the TFT drive circuit layer over the TFT drive circuit layer;
    forming a sealing film over the organic EL light emitting layer;
    adhering a second substrate covering the display part in a position corresponding to the first substrate;
    forming a touch panel sensor substrate and an electrode layer over the second substrate; and
    exposing the plurality of terminals by etching a part of the sealing film while the electrode layer is on an uppermost layer.

2. The method of manufacturing an organic EL display device according to claim 1, wherein an electrode included in the electrode layer is formed using ITO.

3. The method of manufacturing an organic EL display device according to claim 1, wherein forming the electrode layer includes forming lead wiring connecting an electrode included in the electrode layer and an external circuit, and the lead wiring uses a material with a higher conductivity than a material used for the electrode.

4. The method of manufacturing an organic EL display device according to claim 3, further comprising:
    forming a film with thermal conductivity electrically connecting the lead wiring with a rear surface of the first substrate.

5. The method of manufacturing an organic EL display device according to claim 1, wherein a plurality of concave parts are formed by the etching process in a surface of the sensor substrate.

6. The method of manufacturing an organic EL display device according to claim 1, wherein the etching process etches the sealing film using the sensor substrate or the electrode layer as a mask.

7. The method of manufacturing an organic EL display device according to claim 2, wherein a fluorine based gas is used in the etching process.

8. The method of manufacturing an organic EL display device according to claim 7, wherein silicon nitride is used as the sealing film.

\* \* \* \* \*